United States Patent
Yeo et al.

(10) Patent No.: US 7,354,843 B2
(45) Date of Patent: Apr. 8, 2008

(54) METHOD OF FORMING A CAPACITOR THAT INCLUDES FORMING A BOTTOM ELECTRODE IN A STRAINED SILICON LAYER

(75) Inventors: Yee-Chia Yeo, Hsin-Chu (TW); Chenming Hu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 376 days.

(21) Appl. No.: 11/129,086

(22) Filed: May 13, 2005

(65) Prior Publication Data

US 2005/0208717 A1   Sep. 22, 2005

Related U.S. Application Data

(62) Division of application No. 10/627,218, filed on Jul. 25, 2003, now Pat. No. 6,940,705.

(51) Int. Cl.
*H01L 21/20* (2006.01)

(52) U.S. Cl. ............ 438/396; 438/399; 29/25.42; 257/E21.008

(58) Field of Classification Search ............ 438/399
See application file for complete search history.

(56) References Cited

U.S. PATENT DOCUMENTS

| | | | |
|---|---|---|---|
| 4,069,094 A | 1/1978 | Shaw et al. | |
| 4,314,269 A | 2/1982 | Fujiki | |
| 4,497,683 A | 2/1985 | Celler et al. | |
| 4,631,803 A | 12/1986 | Hunter et al. | |
| 4,892,614 A | 1/1990 | Chapman et al. | |
| 4,946,799 A | 8/1990 | Blake et al. | |
| 4,952,993 A | 8/1990 | Okumura | |
| 5,130,773 A | 7/1992 | Tsukada | |
| 5,155,571 A | 10/1992 | Wang et al. | |
| 5,273,915 A | 12/1993 | Hwang et al. | |
| 5,338,960 A | 8/1994 | Beasom | |
| 5,378,919 A | 1/1995 | Ochiai | |
| 5,447,884 A | 9/1995 | Fahey et al. | |
| 5,461,250 A | 10/1995 | Burghartz et al. | |
| 5,479,033 A | 12/1995 | Baca et al. | |

(Continued)

FOREIGN PATENT DOCUMENTS

EP    0 683 522 A2    11/1995

(Continued)

OTHER PUBLICATIONS

"Future Gate Stack," International Sematech, 2001 Annual Report.

(Continued)

Primary Examiner—Stephen W. Smoot
(74) Attorney, Agent, or Firm—Slater & Matsil, L.L.P.

(57) ABSTRACT

A decoupling capacitor is formed in a semiconductor substrate that includes a strained silicon layer. A substantially flat bottom electrode is formed in a portion of the strained silicon layer and a capacitor dielectric overlying the bottom electrode. A substantially flat top electrode overlies said capacitor dielectric. The top electrode is connected to a first reference voltage line and the bottom electrode is connected to a second reference voltage line.

34 Claims, 8 Drawing Sheets

U.S. PATENT DOCUMENTS

| | | | |
|---|---|---|---|
| 5,525,828 A | 6/1996 | Bassous et al. |
| 5,534,713 A | 7/1996 | Ismail et al. |
| 5,596,529 A | 1/1997 | Noda et al. |
| 5,629,544 A | 5/1997 | Voldman et al. |
| 5,656,524 A | 8/1997 | Eklund et al. |
| 5,708,288 A | 1/1998 | Quigley et al. |
| 5,714,777 A | 2/1998 | Ismail et al. |
| 5,763,315 A | 6/1998 | Benedict et al. |
| 5,789,807 A | 8/1998 | Correale, Jr. |
| 5,811,857 A | 9/1998 | Assaderaghi et al. |
| 5,955,766 A | 9/1999 | Ibi et al. |
| 5,965,917 A | 10/1999 | Maszara et al. |
| 5,972,722 A | 10/1999 | Visokay et al. |
| 6,008,095 A | 12/1999 | Gardner et al. |
| 6,015,990 A | 1/2000 | Hieda et al. |
| 6,015,993 A | 1/2000 | Voldman et al. |
| 6,027,988 A | 2/2000 | Cheung et al. |
| 6,046,487 A | 4/2000 | Benedict et al. |
| 6,059,895 A | 5/2000 | Chu et al. |
| 6,100,153 A | 8/2000 | Nowak et al. |
| 6,103,599 A | 8/2000 | Henley et al. |
| 6,107,125 A | 8/2000 | Jaso et al. |
| 6,111,267 A | 8/2000 | Fischer et al. |
| 6,222,234 B1 | 4/2001 | Imai |
| 6,232,163 B1 | 5/2001 | Voldman et al. |
| 6,256,239 B1 | 7/2001 | Akita et al. |
| 6,258,664 B1 | 7/2001 | Reinberg |
| 6,281,059 B1 | 8/2001 | Cheng et al. |
| 6,291,321 B1 | 9/2001 | Fitzgerald |
| 6,294,834 B1 | 9/2001 | Yeh et al. |
| 6,303,479 B1 | 10/2001 | Snyder |
| 6,339,232 B1 | 1/2002 | Takagi |
| 6,358,791 B1 | 3/2002 | Hsu et al. |
| 6,387,739 B1 | 5/2002 | Smith, III |
| 6,407,406 B1 | 6/2002 | Tezuka |
| 6,413,802 B1 | 7/2002 | Hu et al. |
| 6,414,355 B1 | 7/2002 | An et al. |
| 6,429,061 B1 | 8/2002 | Rim |
| 6,433,382 B1 | 8/2002 | Orlowski et al. |
| 6,448,114 B1 | 9/2002 | An et al. |
| 6,448,613 B1 | 9/2002 | Yu |
| 6,475,838 B1 | 11/2002 | Bryant et al. |
| 6,475,869 B1 | 11/2002 | Yu |
| 6,489,684 B1 | 12/2002 | Re et al. |
| 6,498,359 B2 | 12/2002 | Schmidt et al. |
| 6,518,610 B2 | 2/2003 | Yang et al. |
| 6,521,952 B1 | 2/2003 | Ker et al. |
| 6,524,905 B2 | 2/2003 | Yamamichi et al. |
| 6,525,403 B2 | 2/2003 | Inaba et al. |
| 6,555,839 B2 | 4/2003 | Fitzgerald |
| 6,558,998 B2 | 5/2003 | Belleville et al. |
| 6,573,172 B1 | 6/2003 | En et al. |
| 6,576,526 B2 | 6/2003 | Kai et al. |
| 6,586,311 B2 | 7/2003 | Wu |
| 6,600,170 B1 | 7/2003 | Xiang |
| 6,617,643 B1 | 9/2003 | Goodwin-Johansson |
| 6,621,131 B2 | 9/2003 | Murthy et al. |
| 6,633,070 B2 | 10/2003 | Miura et al. |
| 6,653,700 B2 | 11/2003 | Chau et al. |
| 6,657,259 B2 | 12/2003 | Fried et al. |
| 6,657,276 B1 | 12/2003 | Karlsson et al. |
| 6,674,100 B1 | 1/2004 | Kubo et al. |
| 6,686,247 B1 | 2/2004 | Bohr |
| 6,720,619 B1 | 4/2004 | Chen et al. |
| 6,724,019 B2 | 4/2004 | Oda et al. |
| 6,759,717 B2 | 7/2004 | Sagarwala et al. |
| 6,762,448 B1 | 7/2004 | Lin et al. |
| 6,784,101 B1 | 8/2004 | Yu et al. |
| 6,794,764 B1 | 9/2004 | Kamal et al. |
| 6,797,556 B2 | 9/2004 | Murthy et al. |
| 6,803,641 B2 | 10/2004 | Papa Rao et al. |
| 6,812,103 B2 | 11/2004 | Wang et al. |
| 6,867,101 B1 | 3/2005 | Yu |
| 6,872,610 B1 | 3/2005 | Mansoori et al. |
| 6,885,084 B2 | 4/2005 | Murthy et al. |
| 6,891,192 B2 | 5/2005 | Chen et al. |
| 6,924,181 B2 * | 8/2005 | Huang et al. ............... 438/197 |
| 6,969,618 B2 | 11/2005 | Mouli |
| 2001/0028089 A1 | 10/2001 | Adan |
| 2002/0031890 A1 | 3/2002 | Watanabe et al. |
| 2002/0074598 A1 | 6/2002 | Doyle et al. |
| 2002/0076899 A1 | 6/2002 | Skotnicki et al. |
| 2002/0125471 A1 | 9/2002 | Fitzgerald et al. |
| 2002/0153549 A1 | 10/2002 | Laibowitz et al. |
| 2002/0190284 A1 | 12/2002 | Murthy et al. |
| 2003/0001219 A1 | 1/2003 | Chau et al. |
| 2003/0030091 A1 | 2/2003 | Bulsara et al. |
| 2003/0080386 A1 | 5/2003 | Ker et al. |
| 2004/0026765 A1 | 2/2004 | Currie et al. |
| 2004/0087098 A1 | 5/2004 | Ng et al. |
| 2004/0173815 A1 | 9/2004 | Yeo et al. |
| 2004/0217448 A1 | 11/2004 | Kumagai et al. |
| 2004/0262683 A1 | 12/2004 | Bohr et al. |
| 2004/0266116 A1 | 12/2004 | Mears et al. |
| 2005/0029601 A1 | 2/2005 | Chen et al. |
| 2005/0121727 A1 | 6/2005 | Ishitsuka et al. |
| 2005/0224988 A1 | 10/2005 | Tuominen |
| 2005/0236694 A1 | 10/2005 | Wu et al. |

FOREIGN PATENT DOCUMENTS

| | | |
|---|---|---|
| EP | 0 828 296 A2 | 3/1998 |
| WO | WO 03/017336 A2 | 2/2003 |

OTHER PUBLICATIONS

Blaauw, D., et al., "Gate Oxide and Subthreshold Leakage Characterization, Analysis and Optimization," date unknown.

Cavassilas, N., et al., "Capacitance-Voltage Characteristics of Metal-Oxide-Strained Semiconductor Si/SiGe Heterostructures," Nanotech 2002, vol. 1, pp. 600-603.

Chang, L., et al., "Direct-Tunneling Gate Leakage Current in Double-Gate and Ultrathin Body MOSFETs," 2002 IEEE Transactions on Electron Devices, vol. 49, No. 12, Dec. 2002, pp. 2288-2295.

Chang, L., et al., "Reduction of Direct-Tunneling Gate Leakage Current in Double-Gate and Ultra-Thin Body MOSFETs," IEEE, 2001, pp. 4 pages.

Gámiz, F., et al., "Electron Transport in Strained Si Inversion Layers Grown on SiGe-on-Insulator Substrates," Journal of Applied Physics, vol. 92, No. 1, Jul. 1, 2002, pp. 288-295.

Gámiz, F., et al., "Strained-Si/SiGe-on-Insulator Inversion Layers: The Role of Strained-Si Layer Thickness on Electron Mobility," Applied Physics Letter, vol. 80, No. 22, Jun. 3, 2002, pp. 4160-4162.

Huang, X., et al., "Sub-50 nm P-Channel FinFET," IEEE Transactions on Electron Devices, vol. 48, No. 5, May 2001, pp. 880-886.

Ismail, K, et al., "Electron Transport Properties of Si/SiGe Heterostructures: Measurements and Device Implications," Applied Physics Letter, vol. 63, No. 5, Aug. 2, 1993, pp. 660-662.

Jurczak, M., "Silicon-on-Nothing (SON)—an Innovative Process for Advanced CMOS," IEEE Transactions on Electron Devices, vol. 47, No. 11, Nov. 2000, pp. 2179-2187.

Jurczak, M., et al., "SON (Silicon on Nothing)—A New Device Architecture for the ULSI Era," Symposium on VLSI Technology Digest of Technical Papers, 1999, pp. 29-30.

Leitz, C.W. et al., "Channel Engineering of SiGe-Based Heterostructures for High Mobility MOSFETs," Materials Research Society Symposium Proceedings, vol. 686, 2002, pp. 113-118.

Leitz, C.W., et al., "Hole Mobility Enhancements In Strained Si/Si$_{1-y}$Ge$_y$ P-Type Metal-Oxide-Semiconductor Field-Effect Transistors Grown On Relaxed Si$_{1-x}$Ge$_x$ (x<y) Virtual Substrates," Applied Physics Letters, vol. 79, No. 25, Dec. 17, 2001, pp. 4246-4248.

Liu, K.C., et al., "A Novel Sidewall Strained-Si Channel nMOSFET," IEDM, 1999, pp. 63-66.

Maiti, C.K., et al., "Film Growth and Material Parameters," Application of Silicon-Germanium Heterostructure, Institute of Physics Publishing, Ch. 2, (2001), pp. 32-42.

Matthews, J.W., "Defects Associated with the Accommodation of Misfit Between Crystals," J. Vac. Sci. Technol., vol. 12, No. 1, Jan./Feb. 1975, pp. 126-133.

Matthews, J.W., et al, "Defects in Epitaxial Multilayers—I. Misfit Dislocations," Journal of Crystal Growth, vol. 27, 1974, pp. 118-125.

Matthews, J.W., et al., "Defects in Epitaxial Multilayers—II. Dislocation Pile-Ups, Threading Dislocations, Slip Lines and Cracks", Journal of Crystal Growth, vol. 29, 1975, pp. 273-280.

Matthews, J.W., et al., "Defects in Epitaxial Multilayers—III. Preparation of Almost Perfect Multilayers," Journal of Crystal Growth, vol. 32, 1976, pp. 265-273.

Mizuno, T., et al., "Novel SOI p-Channel MOSFETs With Higher Strain in Si Channel Using Double SiGe Heterostructures," IEEE Transactions on Electron Devices, vol. 49, No. 1, Jan. 2002, pp. 7-14.

Nayak, D.K., et al., "Enhancement-Mode Quantum-Well $Ge_xSi_{1-x}$ PMOS," IEEE Electron Device Letters, vol. 12, No. 4, Apr. 1991, pp. 154-156.

Ootsuka, F., et al., "A Highly Dense, High-Performance 130nm Node CMOS Technology for Large Scale System-on-a-Chip Application," International Electron Device Meeting, 2000, pp. 575-578.

Schüppen, A., et al., "Mesa and Planar SiGe-HBTs on MBE-Wafers," Journal of Materials Science: Materials in Electronics, vol. 6, 1995, pp. 298-305.

Shahidi, G.G., "SOI Technology for the GHz Era," IBM J. Res. & Dev., vol. 46, No. 2/3, Mar./May 2002, pp. 121-131.

Shimizu, A., et al., "Local Mechanical-Stress Control (LMC): A New Technique for CMOS-Performance Enhancement," IEDM 2001, pp. 433-436.

Tezuka, T., et al., "High-Performance Strained Si-on-Insulator MOSFETs by Novel Fabrication Processes Utilizing Ge-Condensation Technique," Symposium On VLSI Technology Digest of Technical Papers, 2002, pp. 96-97.

Thompson, S., et al., "A 90 nm Logic Technology Featuring 50nm Strained Silicon Channel Transistors, 7 Layers of Cu Interconnects, Low k ILD, and 1 $um^2$ SRAM Cell," IEDM, Dec. 2002, pp. 61-64.

Tiwari, S., et al. "Hole Mobility Improvement in Silicon-on-Insulator and Bulk Silicon Transistors Using Local Strain," International Electron Device Meeting, 1997, pp. 939-941.

Wang, L.K., et al., "On-Chip Decoupling Capacitor Design to Reduce Switching-Noise-Induced Instability in CMOS/SOI VLSI," Proceedings of the 1995 IEEE International SOI Conference, Oct. 1995, pp. 100-101.

Welser, J., et al., "NMOS and PMOS Transistors Fabricated in Strained Silicon/Relaxed Silicon-Germanium Structures," IEDM, 1992, pp. 1000-1002.

Wong, H.-S.P., "Beyond the Conventional Transistors," IBM J. Res. & Dev., vol. 46, No. 2/3, Mar./May 2002, pp. 133-167.

Yang, F.L., et al, "35nm CMOS FinFETs," Symposium on VLSI Technology Digest of Technical Papers, 2002, pp. 104-105.

Yang, F.L., et al., "25 nm CMOS Omega FETs," IEDM, 2002, pp. 255-258.

Yeoh, J.C., et al., "MOS Gated Si:SiGe Quantum Wells Formed by Anodic Oxidation," Semicond. Sci. Technol., vol. 13, 1998, pp. 1442-1445.

Wolf, S., et al., "Silicon Processing For The VLSI Era," vol. 1: Process Technology, Second Edition, Lattice Press, Sunset Beach, California, 2000, pp. 834-835.

Wolf, S., "Silicon Processing For The VLSI Era," vol. 2: Process Integration, Lattice Press, Sunset Beach, California, 1990, pp. 144-145.

Wolf, Stanley, Ph.D., et al., "Silicon Processing for the VLSI Era," vol. 1: Process Technology, Second Edition, Lattice Press, Sunset Beach, CA, 2000, pp. 374-385.

Wolf, Stanley, Ph.D., "Silicon Processing for the VLSI Era," vol. 2: Process Integration, Lattice Press, Sunset Beach, CA, 1990, pp. 658-663.

* cited by examiner

US 7,354,843 B2

METHOD OF FORMING A CAPACITOR THAT INCLUDES FORMING A BOTTOM ELECTRODE IN A STRAINED SILICON LAYER

CROSS-REFERENCE TO RELATED APPLICATIONS

This application is a divisional of U.S. Pat. No. 6,940,705 entitled "Capacitor with Enhanced Performance and Method of Manufacture," filed on Jul. 25, 2003, which patent is incorporated herein by reference.

TECHNICAL FIELD

The present invention relates generally to semiconductor devices and more particularly to a capacitor with enhanced performance and method of manufacture.

BACKGROUND

Power supply lines in a semiconductor integrated circuit chip supply current to charge and discharge active and passive devices in the integrated circuit. For example, digital complementary metal-oxide-semiconductor (CMOS) circuits draw current when the clock makes a transition. During the operation of circuits, the power supply lines must supply transient currents with a relatively high intensity, and can result in voltage noise on the power supply lines. The voltage on the power supply line will fluctuate when the fluctuation time of the transient current is short or when its parasitic inductance or parasitic resistance is large.

In state-of-the-art circuits, the operational frequency of the integrated circuit is in the order of several hundreds of mega-hertz (MHz) to several giga-hertz (GHz). In such circuits, the rising time of clock signals is very short, so that voltage fluctuations in the supply line can be very large. Undesired voltage fluctuations in the power supply line powering a circuit can cause noise on its internal signals and degrade noise margins. The degradation of noise margins can reduce circuit reliability or even cause circuit malfunction.

To reduce the magnitude of voltage fluctuations in the power supply lines, filtering or decoupling capacitors are usually used between the terminals of different power supply lines or between terminals of power supply line and the ground line. Decoupling capacitors act as charge reservoirs that additionally supply currents to circuits when required to prevent momentary drops in supply voltage.

FIG. 1 shows a circuit diagram containing these decoupling capacitors. Capacitor $C_1$ is a decoupling capacitor that is inserted between a power supply line $V_{DD}$ and the ground line GND. Most chips employ more than one power supply line, and may have a different power supply line $OV_{DD}$ for the output circuits that interface with external circuits. Capacitor $C_2$ is a decoupling capacitor that is inserted between the output voltage supply line $OV_{DD}$ and the ground line GND. Capacitor $C_3$ is a decoupling capacitor that is inserted between the supply line $V_{DD}$ and the output voltage supply line $OV_{DD}$. These decoupling capacitors are usually placed as close as possible to the transient current source or sink.

Decoupling capacitors are used in integrated chips employing both bulk and silicon-on-insulator substrates. However, the role of decoupling capacitors is more important in a silicon-on-insulator chip than in a bulk silicon chip due to the following reason. Integrated chips fabricated on bulk substrates can naturally decouple the power supply potential and the ground potential due to the presence of inherent depletion capacitances between the doped wells and the bulk substrate. Compared to bulk substrates, silicon-on-insulator chips have very low on-chip decoupling capacitance between the power supply lines and ground.

U.S. Pat. No. 6,558,998 entitled "SOI type integrated circuit with a decoupling capacity and process for embodiment of such a circuit" issued to Belleville et al. describes a decoupling capacitor that is formed with the formation of silicon-on-insulator substrates. While that capacitor may be formed with a large area or large capacitance, it is formed together with the substrate, which means that the substrate has to be customized for each different circuit design.

SUMMARY OF THE INVENTION

These and other problems are generally solved or circumvented, and technical advantages are generally achieved, by preferred embodiments of the present invention which teach an integrated circuit capacitor with enhanced performance and method of manufacture a capacitor.

In accordance with a preferred embodiment of the present invention, a capacitor is formed in a strained semiconductor layer. In particular, a bottom electrode is formed in a portion of the strained semiconductor layer. A capacitor dielectric overlies the bottom electrode and a top electrode overlies the capacitor dielectric. In one embodiment, first and second bottom electrode contact regions are formed in the strained semiconductor layer adjacent but not underlying the top electrode. The bottom electrode is located between the first and the second bottom electrode contact regions. In this embodiment, the first bottom electrode region is electrically coupled to the second bottom electrode region, e.g., by at least one metallization layer.

In a second embodiment of the present invention, a decoupling capacitor is formed in a semiconductor substrate that includes a strained silicon layer. A substantially flat bottom electrode is formed in a portion of the strained silicon layer and a capacitor dielectric overlying the bottom electrode. A substantially flat top electrode overlies said capacitor dielectric. The top electrode is connected to a first reference voltage line and the bottom electrode is connected to a second reference voltage line.

The present invention also teaches a method of forming a capacitor. A semiconductor substrate that includes a strained silicon layer is provided. A bottom electrode is formed in the strained silicon layer, e.g., by doping the layer. A capacitor dielectric is formed on bottom electrode and a top electrode is formed on capacitor dielectric. A first doped region and a second doped region are formed within the strained silicon layer adjacent but not beneath the top electrode. These doped regions are electrically connected to each other. Alternatively, only one doped region may be used to electrically contact the bottom electrode.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawing, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

In the preferred embodiment this invention, a capacitor structure with at least one strained electrode is taught. The strained electrode may, for example, be comprised of a strained silicon layer. For example, the strained electrode can be a heavily doped strained silicon layer or it can be an inversion layer in a strained silicon layer.

Figure 2:
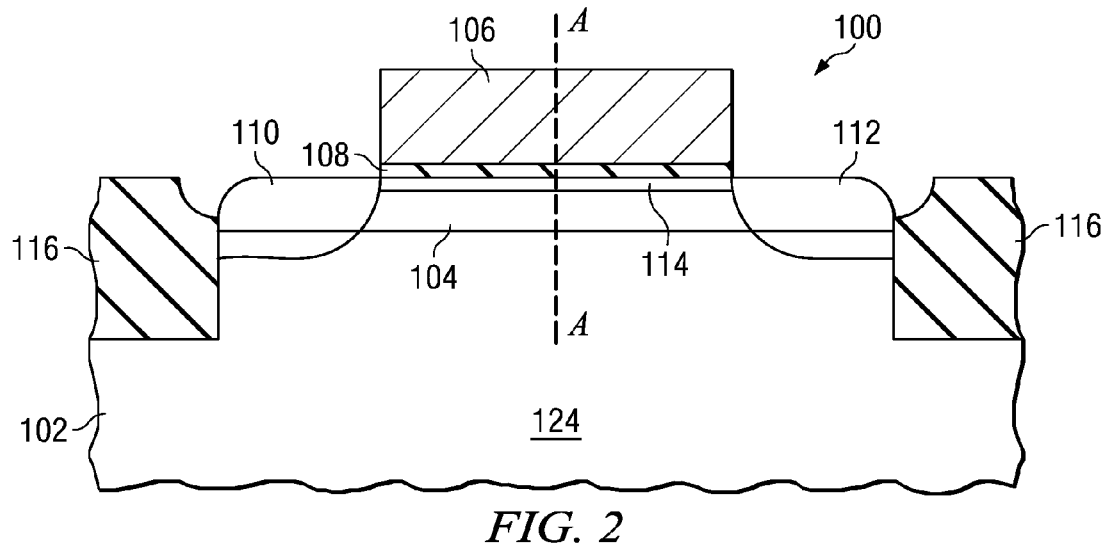
FIG. 2 shows a capacitor of a first embodiment of the present invention.

FIG. 2 shows a specific embodiment of this invention. FIG. 2 shows a semiconductor substrate 102 with a top strained silicon layer 104. A capacitor 100 is formed on substrate 102 and includes top electrode 106 that overlies a capacitor dielectric 108. The bottom electrode of the capacitor is the inversion layer formed in the strained silicon layer 104. One or more doped regions 110 (and 112) are formed adjacent to the inversion layer to electrically contact an inversion layer 114. The capacitor 100 may be isolated from other devices of the semiconductor chip by trench isolation regions 116, for example. The strained silicon region can be formed in a well 124, which may be part of substrate 102.

In the embodiment of FIG. 2, the capacitor is formed from the top electrode 106 and the bottom electrode 104. The top electrode can easily be contacted to since an upper surface is exposed. To contact the bottom electrode, bottom electrode contact regions 110 and/or 112 are provided. In one embodiment, the bottom electrode 104 is doped to the same conductivity type as the contact regions 110 and 112.

In another embodiment, the bottom electrode 104 is doped to a different conductivity type. In this case, the inversion region 114 is provided to create the contact between regions 104, 110 and 112. For example, in one embodiment the contact regions 110 and 112 are physically doped with n-type dopants (e.g., arsenic and/or phosphorus) and the electrode region 104 is physically doped with p-type dopants (e.g., boron). When the top electrode is connected to a high voltage level, inversion region 114 will be formed and will appear to be n-doped. In this manner, the bottom electrode contact regions 110 and/or 112 are doped to a given conductivity type (n-type in this example) and the bottom electrode is operationally doped the first conductivity type. In this context, "operationally doped" means being at that doping level whenever the chip is operational. This definition excludes a transistor, which is at that doping level only when that transistor itself is turned on.

Figure 3A:
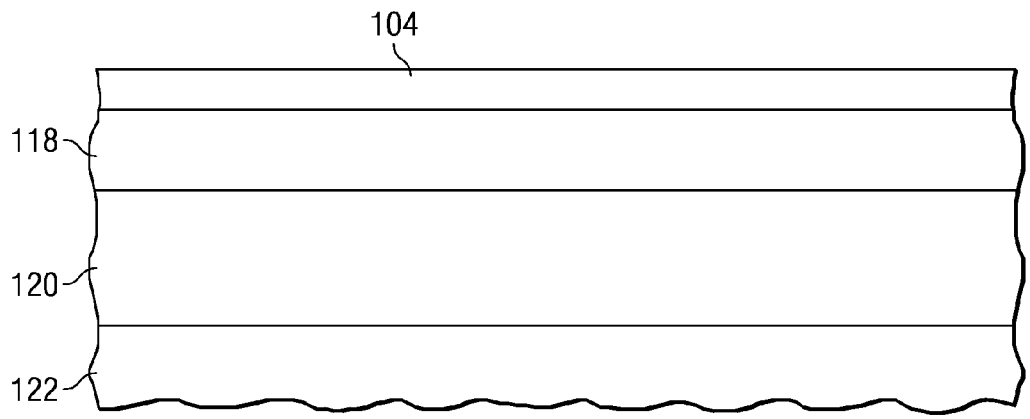
FIGS. 3a-3e provide diagrams to illustrate the concept of a strained layer.

FIGS. 3a-3e show an example of how a strained layer may be formed. In the preferred embodiment, the strained layer 104 is strained silicon. As shown in FIG. 3a, the strained silicon 104 is formed on a semiconductor 118 with a lattice constant that is larger than the relaxed lattice constant of silicon, e.g., relaxed silicon-germanium (SiGe) layer. The relaxed SiGe layer 118 may overlie a graded SiGe buffer layer 120, which is grown on a silicon substrate 122. The relaxed SiGe layer 118 can be thought of as a stressor that introduces strain in the silicon layer 104. The stressor, in this case, is placed below the strained silicon layer 104.

Figure 3B:
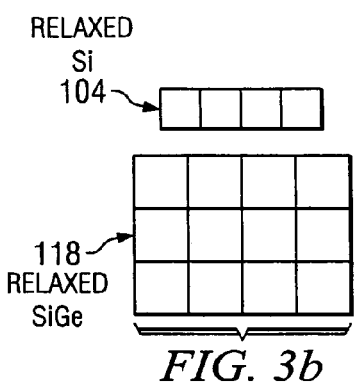
Figure 3C:
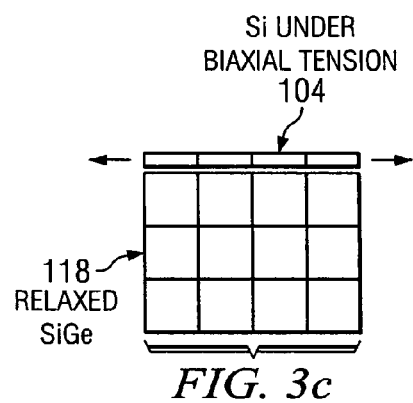

FIGS. 3b and 3c illustrate the effect of the relaxed SiGe layer 118 on a pseudomorphically strained silicon layer 104. FIG. 3b shows that the two semiconductors have different lattice constants in the natural state and FIG. 3c shows the strain created in the silicon layer 104 when the two layers 104 and 118 are joined. The strained silicon 104 may be under biaxial tension. Significant mobility enhancement has been reported for both electrons and holes in silicon under biaxial tensile strain.

Figure 3D:
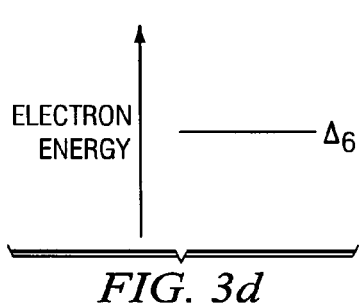
Figure 3E:
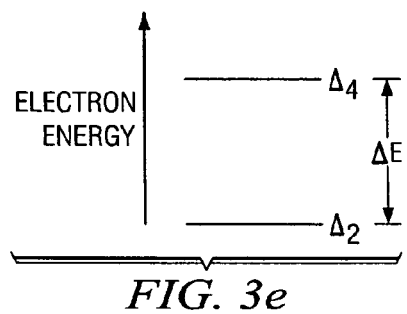

The mobility enhancement can be explained as follows. In relaxed silicon, the electrons reside in the six-fold degenerate $\Delta_6$ conduction valleys as illustrated by FIG. 3d. With the introduction of biaxial tension in silicon, the conduction valleys split into two energy levels as shown in FIG. 3e. The two-fold degenerate valleys labeled $\Delta_2$ has a lower energy and higher in-plane mobility than the four-fold degenerate valleys labeled $\Delta_4$. The difference in energy between the $\Delta_2$ and $\Delta_4$ levels is $\Delta E$. For strained silicon grown on a relaxed $Si_{1-x}Ge_x$ buffer layer, the value of $\Delta E$ is given by 0.67x (in eV). Since most of the electrons reside in the two-fold degenerate valleys, the average electron mobility is significantly improved.

Figure 1:
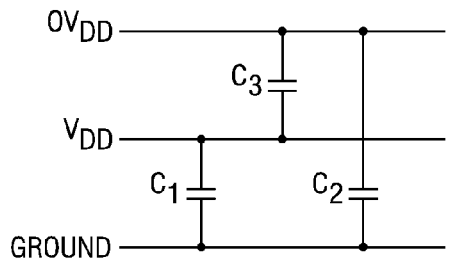
FIG. 1 shows an equivalent circuit of known decoupling capacitors.

According to the preferred embodiment of this invention, a heavily doped strained silicon layer or an inversion region in a strained silicon layer is used as a bottom electrode of a capacitor. The heavily doped strained silicon is preferably heavily doped with n-type dopants, and the inversion region preferably comprises electrons because the mobility of electrons is significantly increased in strained silicon. The resistance of the inversion region is inversely proportional to mobility. A high mobility inversion region has a lower resistance. Therefore, by forming a low resistance inversion layer in the strained silicon layer, and employing it as a bottom electrode of a capacitor, the capacitor is formed with an electrode with significantly improved conductance. The capacitor may be used as a decoupling capacitor in the preferred embodiment, but it is understood that the capacitor thus formed may be used for other analog or digital applications. FIG. 1 shows examples of decoupling capacitors coupled between a first reference voltage line (e.g., $OV_{DD}$, $V_{DD}$ or GROUND) and a second reference voltage line (e.g., $OV_{DD}$, $V_{DD}$ or GROUND).

Figure 4:
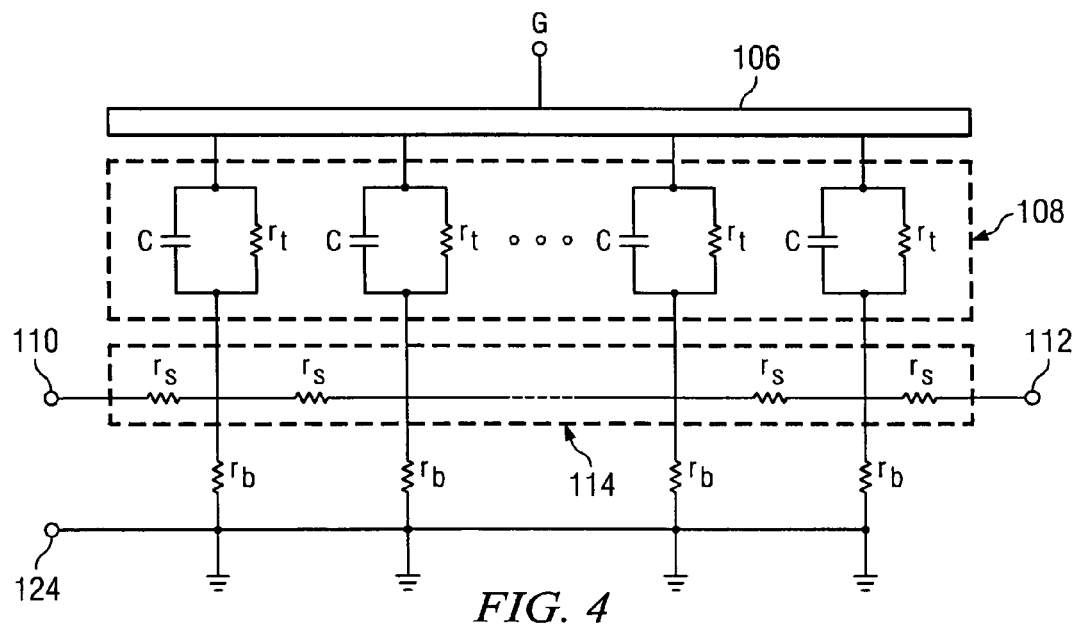
FIG. 4 provides a circuit model or equivalent circuit of a capacitor employing an inversion layer as a bottom electrode.

Referring now to FIG. 4, a circuit model or equivalent circuit of the capacitor 100 is shown. In FIG. 4, the top electrode 106 of the capacitor is depicted using a horizontal bar and connected to a node labeled G. The capacitor dielectric 108 is modeled using a distributed equivalent circuit approach, with a normalized tunneling impedance of the capacitor dielectric $r_t$, and a normalized capacitance density c. A capacitor dielectric with a low leakage has a high $r_t$. Therefore, a large $r_t$ is desired.

On the other hand, the sheet resistance $r_s$ of the inversion layer 114 should be as small as possible. Since the inversion layer 114 electrically communicates with adjacent doped regions 110 and 112, also known as the source and drain regions, the sheet resistances are connected to nodes 110 and 112 at the two ends of the circuit diagram of FIG. 4. The inversion layer 114 is electrically connected to the well region 124 through body resistances $r_b$. The well region 124 is typically connected to a ground potential. The value of $r_b$ is typically large since no significant current flow between the inversion layer and the well region. In addition, since there is no net current flow across the center of the capacitor, each half of the circuit sees an open circuit termination.

The improvement to the sheet resistance of the inversion channel $r_s$ is one of the advantages of the preferred embodiment of this invention. According to this embodiment, by forming the inversion layer in a strained silicon layer and using it as a bottom electrode, the value of $r_s$ is smaller than that in a conventional relaxed silicon channel. A smaller value of $r_s$ contributes to a smaller series resistance in the capacitor, or a smaller resistance in one of the electrodes of the capacitor. A smaller electrode resistance leads to a lower equivalent series resistance (ESR). The ESR is defined to be the impedance or resistance of the capacitor at its resonant frequency. A low ESR is one of the desirable characteristics for a decoupling capacitor used in high frequency circuits. In high frequency circuits, it is advantageous to employ decoupling capacitors with low total impedance of resistance over a wide frequency range.

Figure 5:
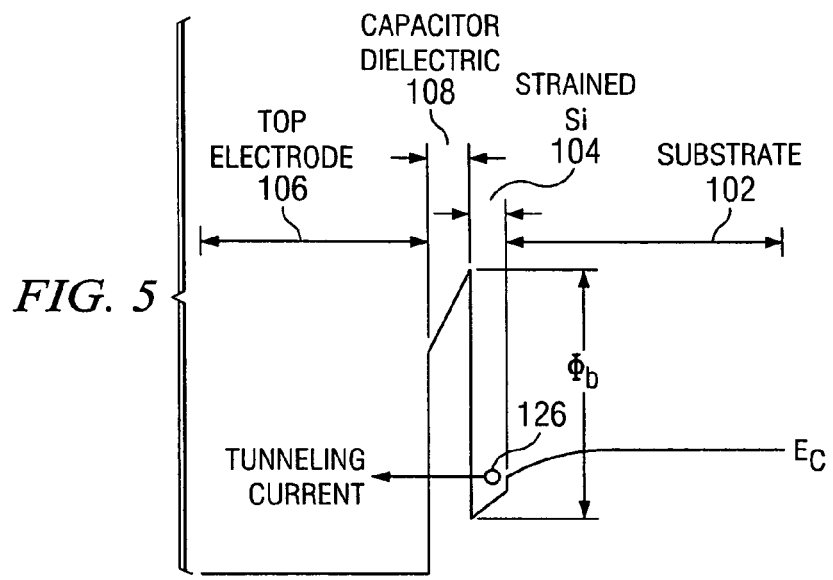
FIG. 5 shows an energy band diagram illustrating the direct tunneling current through the capacitor dielectric.

Another benefit of the preferred embodiment of this invention is the reduction of leakage current through the capacitor dielectric 108. Referring now to FIG. 5, an energy band diagram is drawn to show the conduction band along the line A-A' in the capacitor structure of FIG. 2. The line A-A' passes from the top electrode 106 to the capacitor dielectric 108 to the strained silicon layer 104 and the semiconductor substrate 102. The semiconductor substrate 102 is taken to be SiGe, for example.

An electron (depicted by a circle labeled 126) in the strained silicon layer 104 will see a barrier height given by $\Phi_b$ as indicated in FIG. 5. This electron may be in an inversion layer in the strained silicon 104, or this electron may be a mobile carrier in a heavily doped strained silicon layer. The quantum mechanical tunneling of the electron through the capacitor dielectric 108 to the top electrode 106 contributes to a tunneling leakage current, which is undesirable. Due to the splitting of the energy levels in the conduction band of the strained silicon layer, the bottom-most $\Delta_2$ level in the strained silicon layer has a reduced or lower energy level compared to the $\Delta_6$ level in a relaxed silicon layer. As a result of the reduced energy level in the conduction band of the strained silicon, the barrier height seen by the electron will be larger. The larger barrier height results in a reduced tunneling probability and therefore a reduced leakage current. Therefore, a capacitor structure employing strained silicon as the bottom electrode gives a lower leakage current compared to one using relaxed silicon as the bottom electrode.

Figure 6:
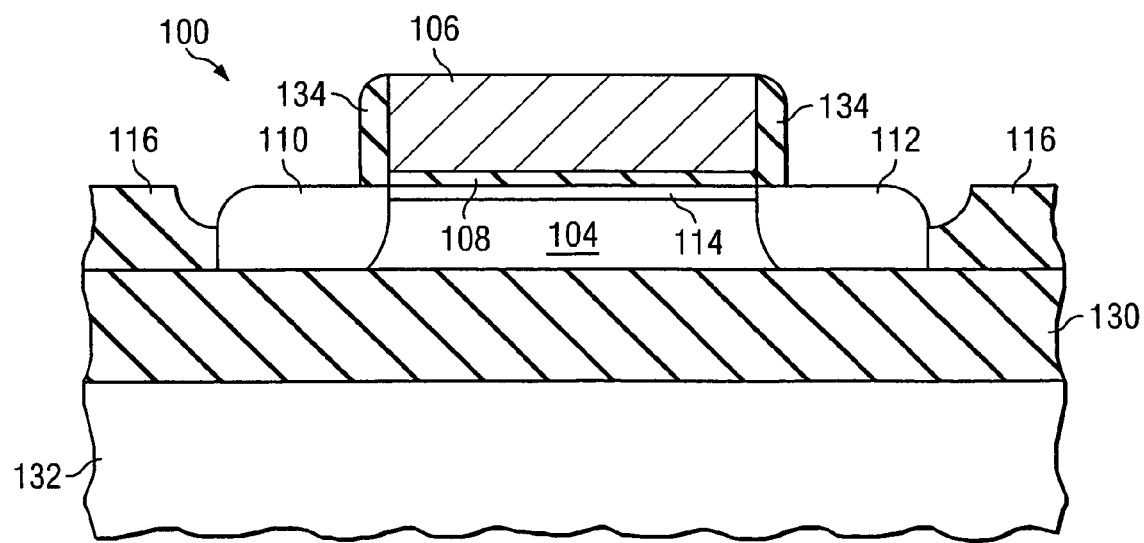
FIG. 6 shows a capacitor of a second embodiment of the present invention.

FIG. 6 shows another embodiment of the present invention where the strained silicon 104 is formed not on a relaxed silicon germanium buffer layer, but on an insulator layer 130. Such a substrate 132 is also known as a strained-silicon-on-insulator (SSOI) substrate, and comprises a strained silicon layer 104 overlying an insulator layer 130, which in turn overlies a semiconductor substrate 132. Another semiconductor layer (not shown), such as a SiGe layer, may or may not be inserted between the strained silicon layer 104 and the insulator layer 130.

Such a substrate 132 may be formed by a layer transfer technique, such as by the transfer of a strained silicon layer onto a target wafer with an insulator surface. The bottom electrode 104 may be lightly doped and electrically contacted by a highly doped region, or the bottom electrode 104 may be a high-doped region.

In FIG. 6, the capacitor is isolated from other circuit elements by trench isolation 116, but it is understood that other forms of isolation, for example, mesa isolation may be used. In mesa isolation, trenches are not filled with a dielectric filling material prior to the formation of transistors or capacitors. In a semiconductor chip employing mesa isolation, trenches between active regions are not filled with dielectric prior to the formation of active devices.

According to embodiments of this invention, the capacitor dielectric 108 can be any dielectric. For example, the capacitor dielectric can be conventional gate dielectrics known and used in the art, e.g. silicon oxide, silicon oxynitride, or silicon nitride, or combinations thereof. In another embodiment, the capacitor dielectric may be comprised of a high permittivity (high-k) dielectric. By using a high-k dielectric as the capacitor dielectric, the capacitance density $$\frac{\varepsilon_0 \varepsilon_r}{t_{phys}}$$

is significantly higher than that of a capacitor employing a conventional silicon oxide dielectric, where $\varepsilon_0$ is the permittivity of free space, $\varepsilon_r$ is the relative permittivity, and $t_{phys}$ is the physical thickness of the capacitor dielectric.

The high-k dielectric preferably has a permittivity of larger than about 5, and more preferably has a permittivity of larger than about 10, and even more preferably has a permittivity of larger than about 20. The high permittivity dielectric may be selected from a group comprising of aluminum oxide ($Al_2O_3$), hafnium oxide ($HfO_2$), hafnium oxynitride (HfON), hafnium silicate ($HfSiO_4$), zirconium oxide ($ZrO_2$), zirconium oxynitride (ZrON), zirconium silicate ($ZrSiO_4$), or combinations thereof. In the preferred embodiment, the high-k dielectric is hafnium oxide. The silicon oxide equivalent thickness (EOT) of the capacitor dielectric is preferably smaller than about 100 angstroms, more preferably smaller than about 50 angstroms, and even more preferably smaller than about 10 angstroms. The physical thickness of the capacitor dielectric may be smaller than about 100 angstroms, more preferably smaller than about 50 angstroms, and even more preferably smaller than about 10 angstroms.

The top electrode 106 comprises a conductive material such as poly-crystalline silicon, poly-crystalline silicon-germanium, a metal, a metallic nitride, a metallic silicide, or a metallic oxide, or combinations thereof. Metals such as molybdenum, tungsten, titanium, tantalum, platinum, and hafnium may be used as the portion of the top electrode 106. Metallic nitrides may include, but are not limited to, molybdenum nitride, tungsten nitride, titanium nitride, and tantalum nitride. Metallic silicides may include, but are not limited to, nickel silicide, cobalt silicide, tungsten silicide, titanium silicide, tantalum silicide, platinum silicide, and erbium silicide. Metallic oxides may include, but are not limited to, ruthenium oxide and indium tin oxide.

The decoupling capacitor 100 may be formed in an active region in the vicinity of an active device such as a transistor (not shown). The capacitor dielectric may comprise the same dielectric as the transistor gate dielectric.

Figure 7:
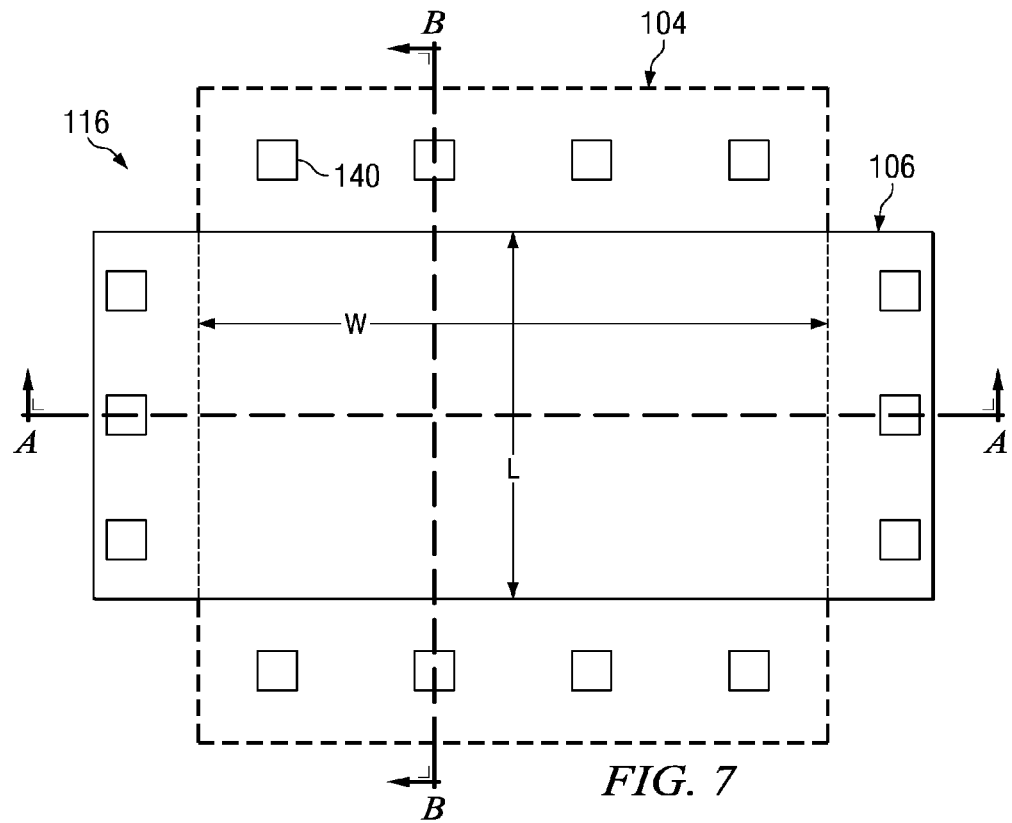
FIG. 7 shows a top view or layout of a capacitor of the present invention.

FIG. 7 is a top view or layout view of the capacitor 100 of the preferred embodiment of this invention. The capacitor 100 has a width W and a length L. In the preferred embodiment, the width W may have a dimension of larger than about 5 microns, and preferably larger than about 10 microns. In the preferred embodiment, the length L may have a dimension of larger than about 1 micron, and preferably larger than about 5 microns. In the preferred embodiment, the area of the capacitor is greater than about 5 $\mu m^2$. The detailed structure of the capacitor may be seen in cross-sectional views along the lines A-A' and B-B' in FIGS. 8a and 8b.

Figure 8A:
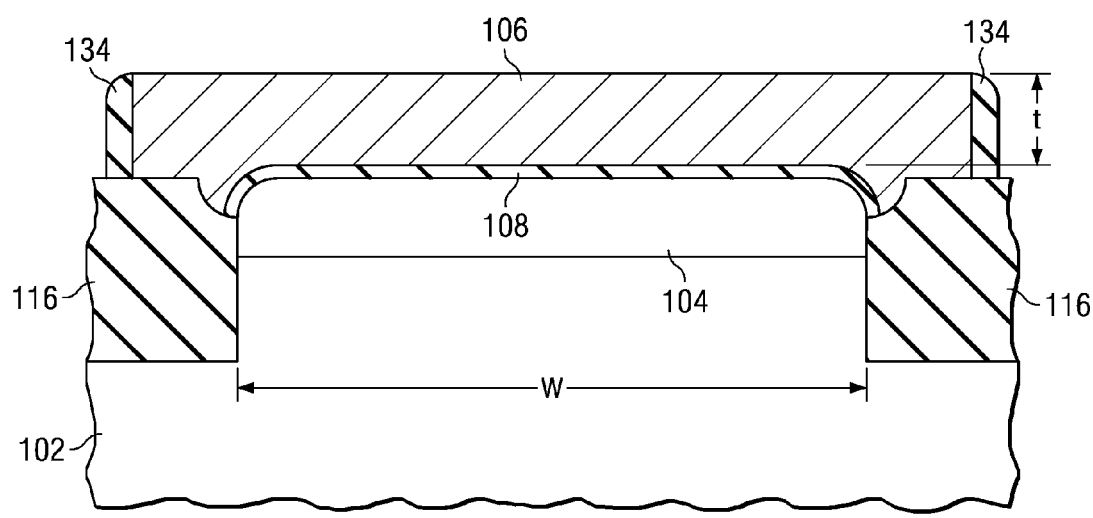
FIGS. 8a and 8b show cross sectional views of the capacitor of FIG. 7.

The cross-sectional view along line A-A' is shown in FIG. 8a. The top electrode 106 extends laterally into the isolation regions 116. The isolation regions 116 may comprise isolation structures known and used in the art, such as shallow trench isolation. The shallow trench isolation structure may comprise a dielectric filling material such as chemical vapor deposited silicon oxide. The shallow trench isolation structure 116 may also comprise trench liner oxide (not shown for simplicity) on the boundaries of the trench. The trench liner oxide may or may not contain nitrogen.

The top electrode in FIG. 8a is shown to have a thickness t, preferably in the range of about 200 angstroms to about 2000 angstroms, typically less than about 500 angstroms. The capacitor structure 100 may additionally have spacers 134 formed on the sides of the top electrode 106. The top electrode 106 may be formed of the same material as the gate electrode of other transistors on the same chip.

Figure 8B:
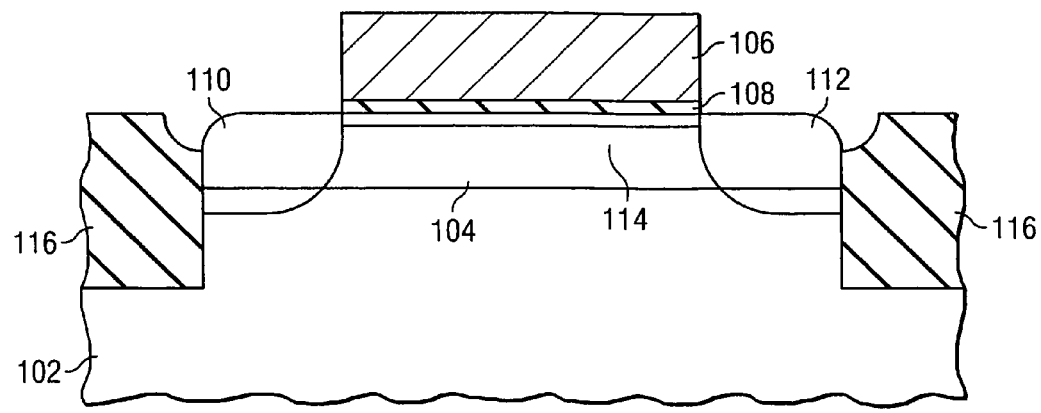

The cross-sectional view along line B-B' is shown in FIG. 8b. This figure shows that the bottom electrode 104 may be electrically connected via adjacent doped regions 110 and 112. In the case where the bottom electrode 104 is not heavily doped, the bottom electrode may comprise an inversion layer 114. An inversion layer may be formed by a supply of mobile carriers from the adjacent doped regions 110 and 112, and when there is a substantial bias between the top and bottom electrodes. The substantial bias can be the potential between VDD and GND, between OVDD and GND, or between OVDD and VDD.

For reasons of simplicity, the contacts 140 have not been shown in the cross-sectional views of FIGS. 8a and 8b. These contact plugs 140 are shown in FIGS. 9a and 9b, which will be discussed next.

Figure 9A:
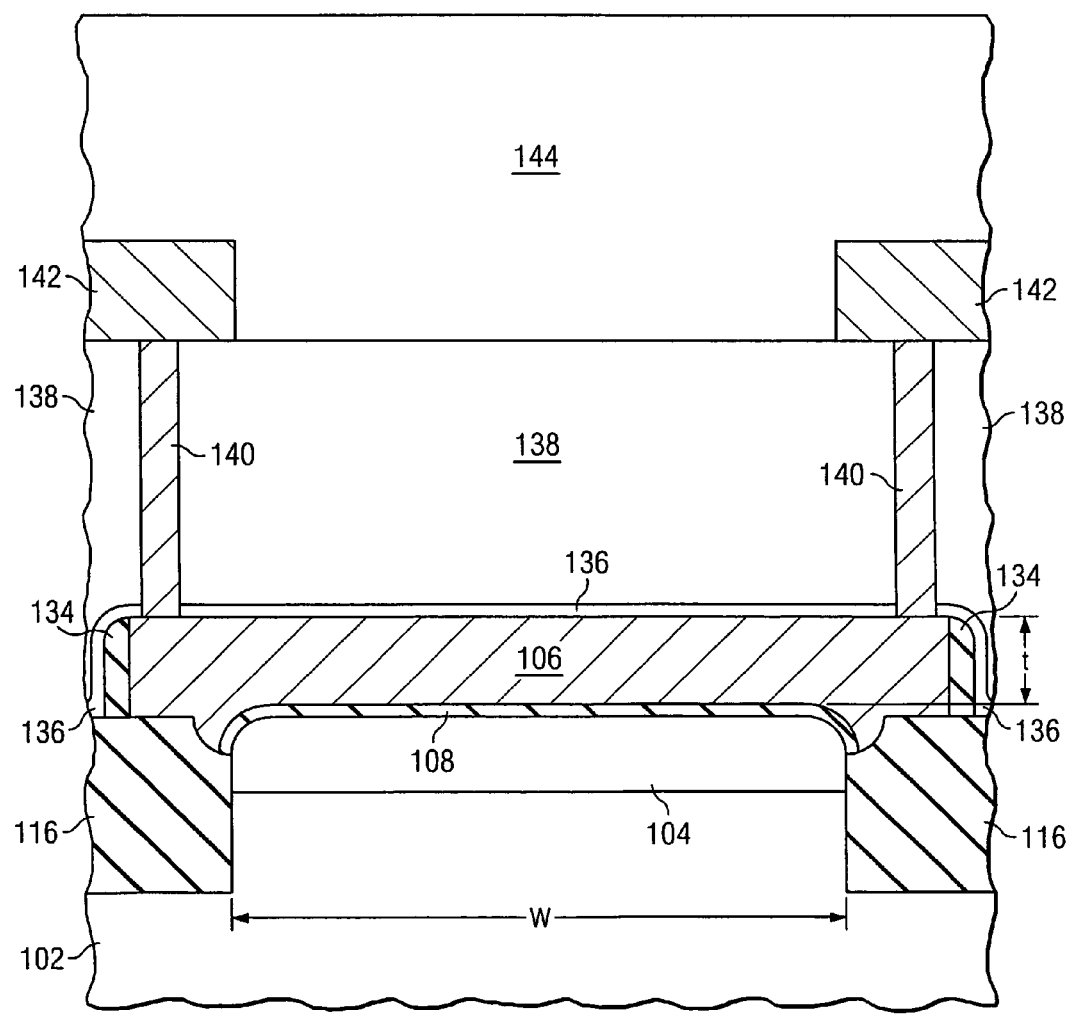
FIGS. 9a and 9b show cross sectional views of another embodiment capacitor.
Figure 9B:
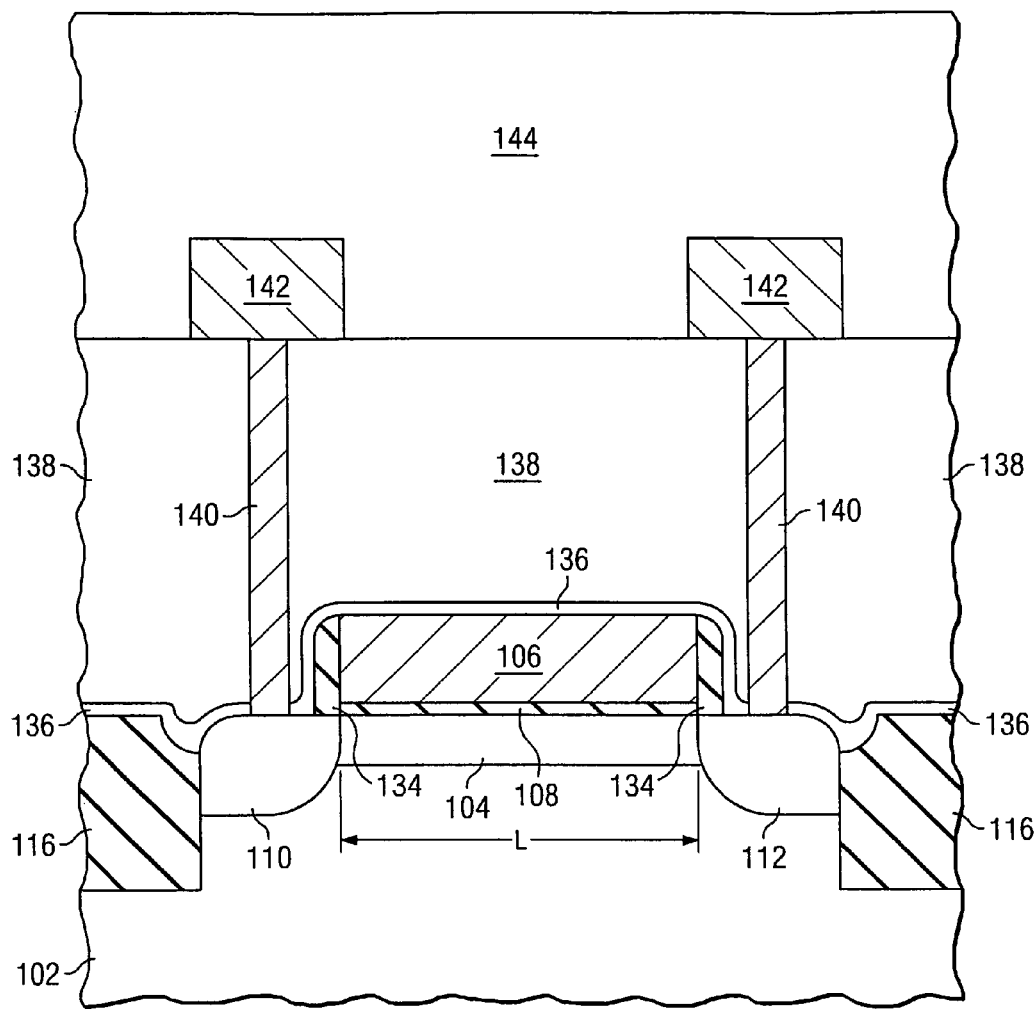

FIGS. 9a and 9b show yet another embodiment of the present invention where the strained silicon layer 104 is formed in a portion of the semiconductor substrate 102. In this case, the strain may be induced by local mechanical stress, such as that due to the influence of a high stress film 136. FIG. 9a shows the cross-sectional view along line A-A' of FIG. 7 and FIG. 9b shows the cross-sectional view along line B-B' of FIG. 7. These figures include the inter-layer dielectric 138 and contact plugs 140. Contact plugs 140 serve to electrically couple top electrode 106 (FIG. 9a) and doped regions 110 and 112 (FIG. 9b) to portions of the first metal layer 142. This metal layer 142 is covered by inter-layer dielectric 144.

The inter-layer dielectric (ILD) 138 and/or 144 can be a chemical vapor deposited dielectric such as silicon oxide. Either one or both of ILDs 138 and 144 can also be a low permittivity (low-k) dielectric employed in interconnect technology. For example, by using a low-k ILD 138 to cover the capacitor, parasitic capacitances between the top electrode 106 and metal lines 142 in the vicinity of the top electrode 106 can be reduced. By using a low-k ILD 144 over first metal layer 142, parasitic capacitances between the first metal layer 142 and the second metal layer (not shown) can also be reduced.

In the preferred embodiment, the relative permittivity of the low-k dielectric is less than about 3.5, and more preferably less than about 3.0. For example, the low-k dielectric material may be an organic material, such as benzocyclobutene (BCB), SILK™, FLARE™, or others. Alternatively, the low-k dielectric material may be an inorganic dielectric material, such as methyl silsesquioxane (MSQ), hydrogen silsesquioxane (HSQ), SiOF, as examples. These materials are exemplary only as other embodiments may include different low-k dielectric materials.

A contact etch-stop layer 136 may overlie the top electrode 106 and the spacer 134, as shown in FIG. 9a. The contact etch-stop layer 136 is preferably silicon nitride, but it is understood that other materials with a different etch rate from the ILD may be used. The silicon nitride etch-stop layer 106 may have an inherent stress in the range of −2 giga-pascals (GPa) to +2 GPa, where negative stress implies compressive stress and positive stress implies tensile stress.

As shown in FIG. 9a, a contact plug 140 electrically couples the top electrode 106 to interconnect metal lines 142. As shown in FIG. 9b, another contact plug 140 electrically connects the doped region 110 (112) in the semiconductor layer to the metal lines 142. This connection serves to electrically couple the bottom electrode 104 of the capacitor.

Figure 10A:
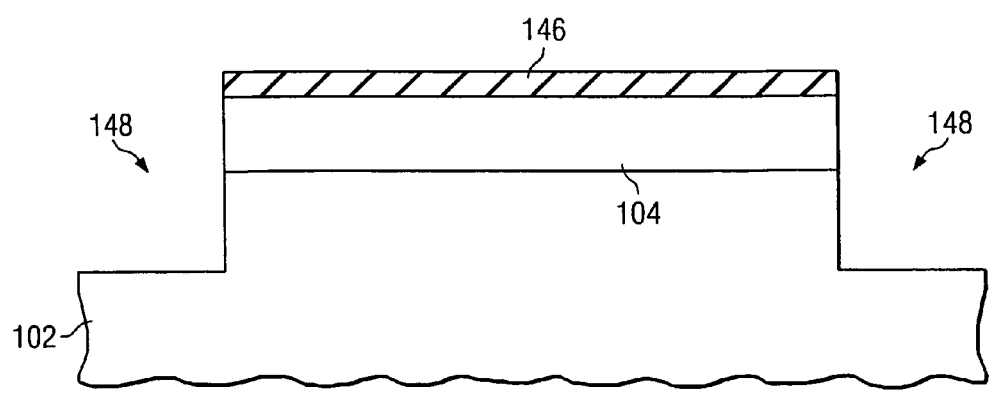
FIGS. 10a-10f show cross sectional views of a capacitor of the present invention during various stages of the fabrication process.

Next, a method of manufacturing the decoupling capacitor will be described with respect to FIGS. 10a-10f. Referring now to FIG. 10a, a semiconductor substrate 102 comprising a topmost strained silicon layer 104 is provided. For example, the semiconductor substrate 102 may comprise a strained silicon layer overlying a relaxed SiGe layer as shown in FIG. 3. The germanium concentration in the relaxed SiGe layer may be in the range of 10% to 90%, and more preferably from 20% to 40%. The thickness of the strained silicon layer 104 is preferably below its critical thickness. In the preferred embodiment, the thickness of the strained silicon layer is in the range of about 20 angstroms to about 500 angstroms. In another example, the semiconductor substrate may be strained silicon on insulator substrate.

An active region mask 146 is used to define trenches 148 in the semiconductor layer 104. The mask 146 preferably comprises silicon nitride, and more preferably comprises silicon nitride on a silicon oxide layer. Trench filling dielectric material is deposited by chemical vapor deposition to fill the trenches to create isolation regions 116. As explained in U.S. Pat. No. 6,882,025, the isolation regions 116 may induce additional stress. U.S. Pat. No. 6,882,025 is incorporated herein by reference.

Figure 10B:
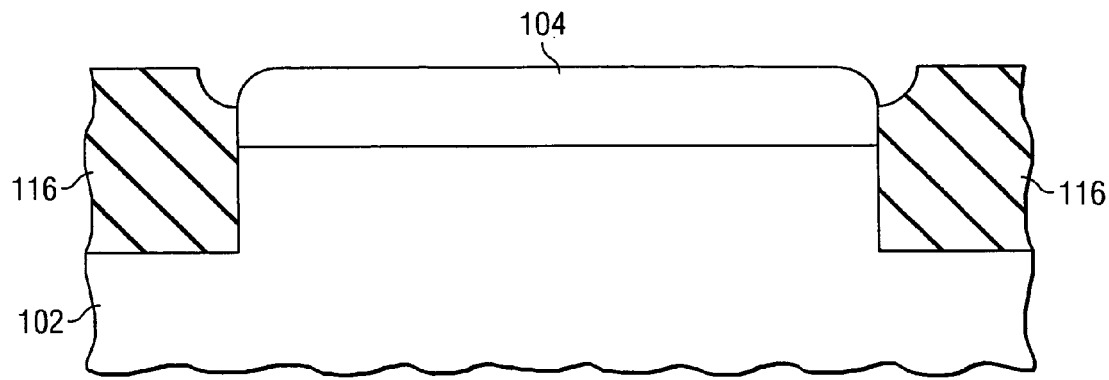

The process continues with a chemical mechanical process step to planarize the top surface of the device being fabricated. The mask 146 can then removed using common etching techniques. FIG. 10b shows the cross-section at this stage in the fabrication process.

The bottom electrode 104 may or may not be heavily doped at this point. If an ion implantation step with a high dose is introduced into the active region 104 at this point to dope the semiconductor layer, a heavily doped bottom electrode can be formed. For example, the heavily doped active region or bottom electrode may have a doping concentration of larger than $10^{19}$ cm$^{-3}$.

Figure 10C:
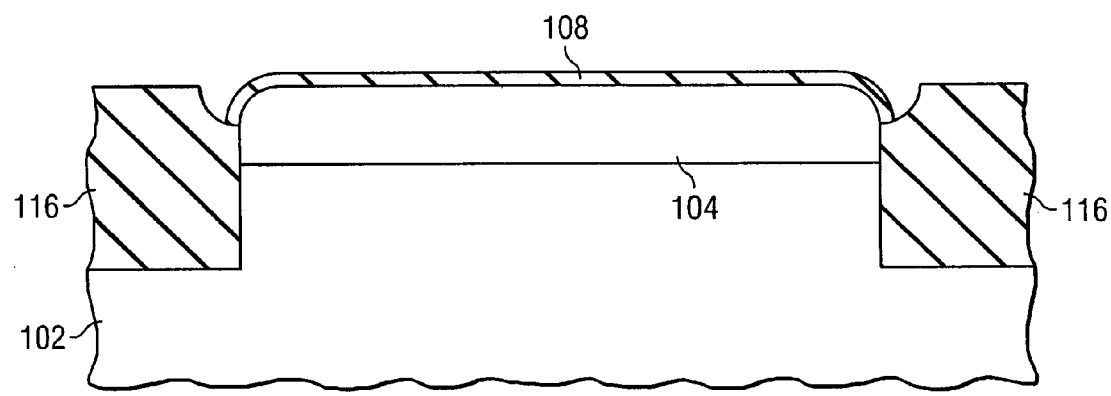

The capacitor dielectric 108 is then formed, as shown in FIG. 10c. The physical thickness of the capacitor dielectric 108 may be smaller than 100 angstroms, more preferably smaller than 50 angstroms, and even more preferably smaller than 10 angstroms. The capacitor dielectric 108 may be formed together with the formation of a transistor gate dielectric in a different portion of the semiconductor chip (not shown). For example, the capacitor dielectric 108 may be formed by thermal oxidation, chemical vapor deposition, sputter deposition, or any other techniques known and used in the art for forming gate dielectrics. By forming the capacitor dielectric together with the gate dielectric of a transistor in a different portion of the chip, no additional process steps are introduced. Dielectric materials as previously described may be used. The capacitor dielectric may be comprised of one or more layers of dielectric materials.

Figure 10D:
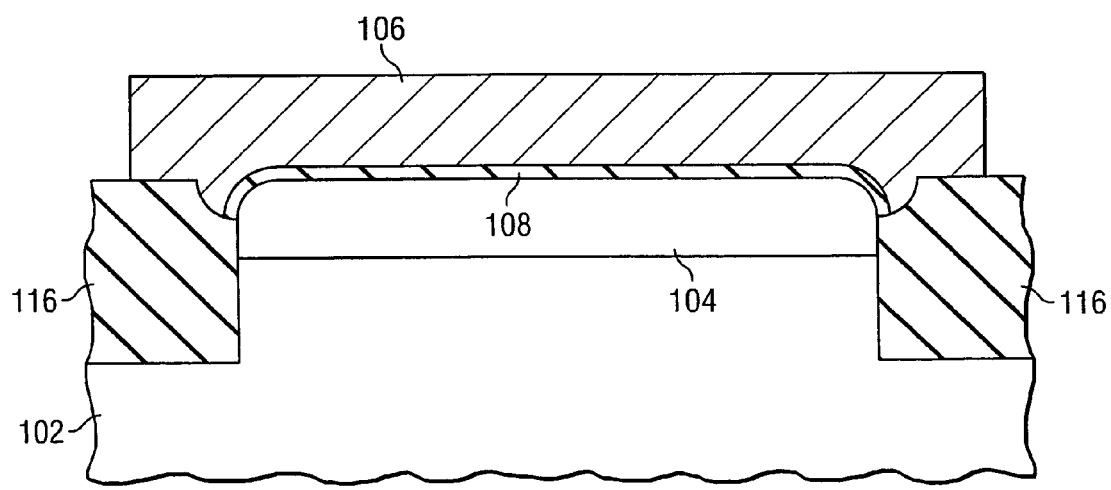

Referring to FIG. 10d, the top electrode material 106 can then be deposited over the capacitor dielectric layer. The top electrode material 106 can be comprised of conventional poly-crystalline silicon, poly-crystalline silicon germanium, metals, metallic silicides, or metallic nitrides, as previously described. The top electrode material 106 may be deposited by conventional techniques such as chemical vapor deposition. The top electrode 106 may also be formed by the deposition of silicon and metal, followed by an anneal to form a metal silicide gate electrode material.

The top electrode material 106 is then patterned using photolithography techniques, and etched using plasma etch processes to form the gate electrodes. The deposition of the top electrode material may be the same process step as the deposition of gate electrode material of a transistor to be formed in a different portion of the semiconductor chip, and the etching of the top electrode may similarly be accomplished together with the etching of the gate electrode of the said transistor. The completed top electrode is shown in FIG. 10d. The capacitor dielectric is retained at least in the portion of the capacitor covered by the top electrode.

At this point, doping may be introduced in regions adjacent to the bottom electrode to make electrical contacts with the bottom electrode. These regions are shown in the cross-section of FIG. 8b and FIG. 9b (in planes above and below the page in FIG. 10d).

Figure 10E:
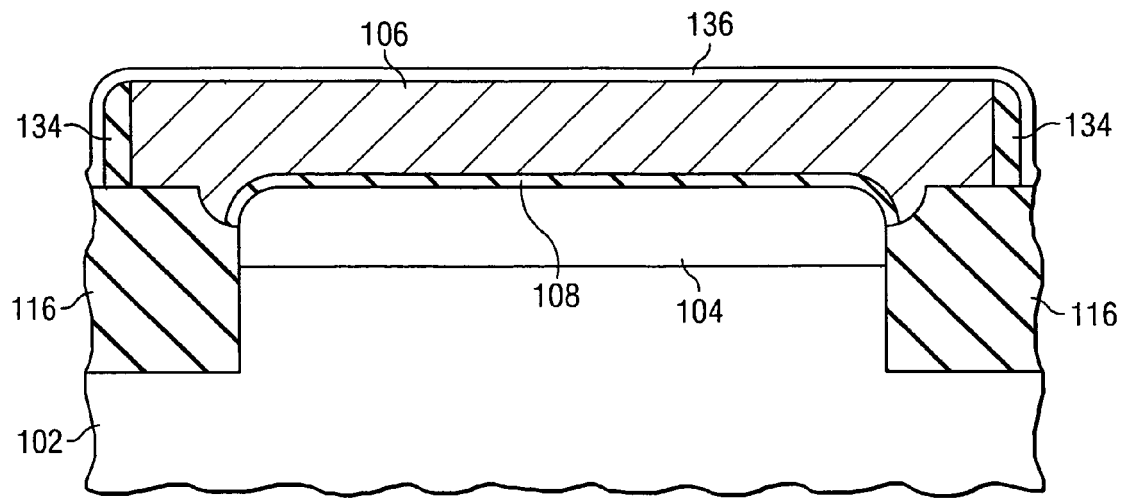
Figure 10F:
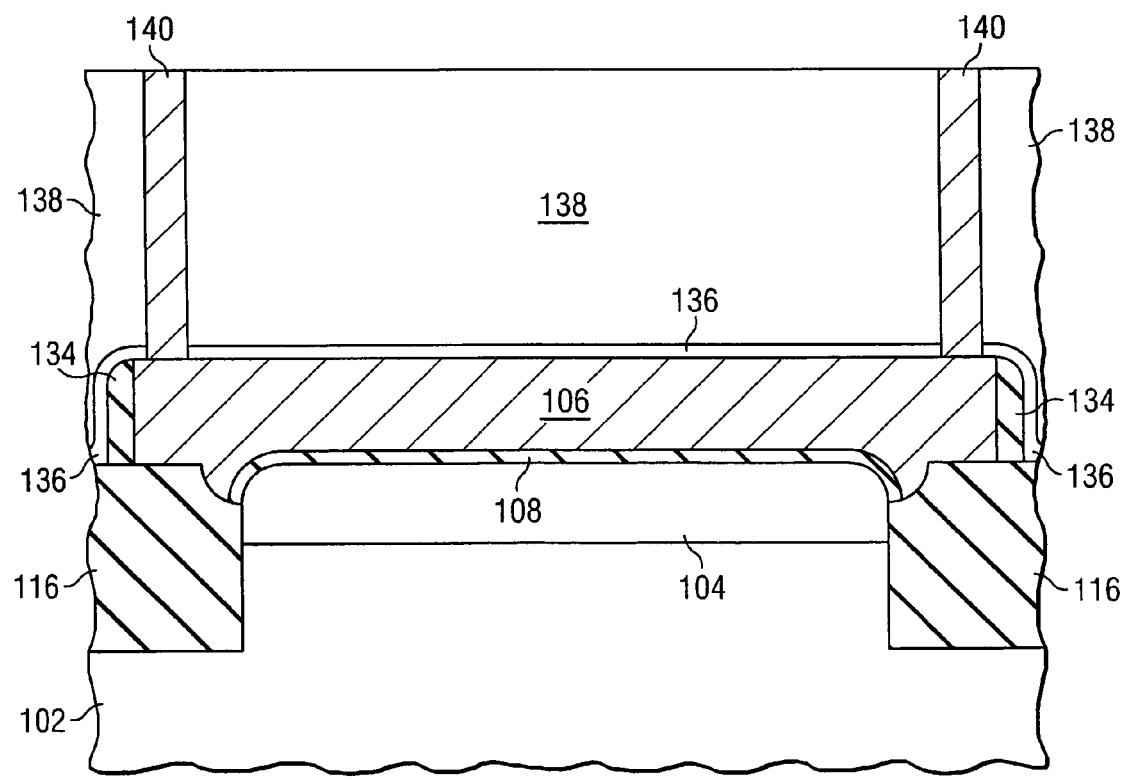

As shown in FIG. 10e, spacers 134 may be additionally formed on the sides of the top electrode. This may be followed by another implant to dope the regions of the active region not covered by the spacers. Once again, these process steps follow the process used to form the lightly doped and heavily doped source and drain regions of the transistors (not shown) being fabricated on the chip.

A contact etch-stop layer 136 may be formed on the top electrode 106 and spacers 134. The etch-stop layer 136 may be a high-stress film such as a high-stress silicon nitride film deposited by plasma-enhanced chemical vapor deposition. The high-stress film may be used to enhance the strain in the strained silicon region 104.

An inter-layer dielectric (ILD) 138 may be formed over the capacitor and contact holes etched through the ILD 138 to reach the top and bottom electrodes of the capacitor. Conductive materials are then used to fill the contact holes to electrically contact the top and bottom electrodes. For example, a layer of tungsten can be formed to fill the holes and then either etched back or chemically-mechanically polished.

Although the capacitor described in this invention has been illustrated for use as a decoupling capacitance, it is understood that the capacitor thus formed according to this invention may be used for other purposes. For example, the capacitor may be used as a coupling capacitor. In another embodiment, the capacitor can be used as the storage cell in a dynamic random access memory or in a mixed signal circuit such as an analog-to-digital converter or a digital-to-analog converter.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of forming a capacitor, the method comprising:
   providing a semiconductor substrate including a strained silicon layer;
   forming a bottom electrode in the strained silicon layer;
   forming a capacitor dielectric on bottom electrode;
   forming a top electrode on capacitor dielectric;
   forming a bottom electrode contact region within the strained silicon layer adjacent the bottom electrode; and
   electrically connecting the bottom electrode and the bottom electrode contact region.

2. The method of claim 1 wherein the capacitor is a decoupling capacitor, the method further comprising connecting the bottom electrode to a first reference node and connecting the top electrode to a second reference node.

3. The method of claim 1 wherein forming the bottom electrode comprises:
   forming an active region;
   forming isolation regions surrounding the active region; and
   doping the active region to form a bottom electrode.

4. The method of claim 3 wherein the active region has a doping concentration of larger than about $10^{19}$ cm$^{-3}$.

5. The method of claim 1 wherein the step of forming the capacitor dielectric comprises:
   forming an interfacial oxide layer; and
   forming a high permittivity dielectric layer.

6. The method of claim 1 wherein forming bottom electrode contact region comprises:
   doping a portion of the strained silicon layer not covered by top electrode;
   forming spacers on sides of the top electrode; and
   doping a portion of the silicon layer not covered by the top electrode and spacers.

7. The method of claim 6 wherein the spacers comprise silicon nitride.

8. The method of claim 6 further comprising:
   depositing an etch-stop layer over top electrode and spacers;
   forming an inter-layer dielectric over etch-stop layer;
   forming contact holes in inter-layer dielectric; and
   filling the contact holes with a conductive material to form contact plugs.

9. The method of claim 8 wherein the etch-stop layer comprises silicon nitride, and wherein the inter-layer dielectric comprises silicon oxide.

10. The method of claim 8 wherein the inter-layer dielectric comprises a dielectric with a relative permittivity smaller than about 3.5.

11. The method of claim 1 wherein the top electrode is connected to a power supply line and the bottom electrode is connected to a ground line.

12. The method of claim 1 wherein the top electrode is connected to a first power supply line and the bottom electrode is connected to a second power supply line.

13. The method of claim 1 wherein the semiconductor substrate further comprises a silicon germanium layer underlying the strained silicon layer.

14. The method of claim 13 wherein the silicon germanium layer has a germanium concentration in the range of about 20 to about 40%.

15. The method of claim 1 wherein the semiconductor substrate further comprises an insulator layer underlying the strained silicon layer.

16. The method of claim 15 wherein the insulator layer has a thickness of less than about 1200 angstroms.

17. The method of claim 1 wherein the strained silicon layer has a thickness in the range of about 20 angstroms to about 500 angstroms.

18. The method of claim 1 wherein the top electrode comprises poly-crystalline silicon or poly-crystalline silicon-germanium.

19. The method of claim 1 wherein the top electrode is selected from the group consisting of molybdenum, tungsten, titanium, tantalum, platinum, and hafnium.

20. The method of claim 1 wherein the top electrode is selected from the group consisting of molybdenum nitride, tungsten nitride, titanium nitride, tantalum nitride, and combinations thereof.

21. The method of claim 1 wherein the top electrode is selected from the group consisting of nickel silicide, cobalt silicide, tungsten silicide, titanium silicide, tantalum silicide, platinum silicide, erbium silicide, and combinations thereof.

22. The method of claim 1 wherein the top electrode is selected from the group consisting of ruthenium oxide, indium tin oxide, and combinations thereof.

23. The method of claim 1 wherein the capacitor dielectric comprises a high permittivity dielectric.

24. The method of claim 23 wherein the high permittivity dielectric is selected from the group consisting of aluminum oxide, hafnium oxide, hafnium oxynitride, hafnium silicate, zirconium oxide, zirconium oxynitride, zirconium silicate, and combinations thereof.

25. The method of claim 23 wherein the high permittivity dielectric has a relative permittivity of larger than about 10.

26. The method of claim 23 wherein the high permittivity dielectric has a relative permittivity of larger than about 20.

27. The method of claim 1 wherein the capacitor has a length of larger than about 10 microns.

28. The method of claim 1 wherein the capacitor has a length of larger than about 5 microns.

29. A method of forming a decoupling capacitor, the method comprising:
   providing a semiconductor substrate including a strained silicon layer,
   forming a substantially flat bottom electrode in a portion of the strained silicon layer;
   forming a capacitor dielectric over the bottom electrode;
   forming a substantially flat top electrode over said capacitor dielectric;
   electrically coupling the top electrode to a first reference voltage line; and
   electrically coupling the bottom electrode to a second reference voltage line.

30. The method of claim 29 wherein the top electrode is electrically coupled to a power supply line and the bottom electrode is electrically coupled to a ground line.

31. The method of claim 29 wherein the top electrode is electrically coupled to a first power supply line and the bottom electrode is electrically coupled to a second power supply line.

32. The method of claim 29 wherein the semiconductor substrate comprises a silicon germanium layer underlying the strained silicon layer.

33. The method of claim 29 wherein the semiconductor substrate comprises an insulator layer underlying the strained silicon layer.

34. The method of claim 29 wherein forming a capacitor dielectric comprises forming a high permittivity dielectric.

* * * * *